(12) United States Patent
Xi et al.

(10) Patent No.: US 12,278,081 B2
(45) Date of Patent: Apr. 15, 2025

(54) SYSTEM AND METHOD FOR ALIGNMENT OF SECONDARY BEAMS IN MULTI-BEAM INSPECTION APPARATUS

(71) Applicant: ASML Netherlands B.V., Veldhoven (NL)

(72) Inventors: Qingpo Xi, Fremont, CA (US);
Xuerang Hu, San Jose, CA (US);
Xuedong Liu, San Jose, CA (US);
Weiming Ren, San Jose, CA (US);
Zhong-Wei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 444 days.

(21) Appl. No.: 17/598,841

(22) PCT Filed: Mar. 6, 2020

(86) PCT No.: PCT/EP2020/055959
§ 371 (c)(1),
(2) Date: Sep. 27, 2021

(87) PCT Pub. No.: WO2020/193102
PCT Pub. Date: Oct. 1, 2020

(65) Prior Publication Data
US 2022/0189726 A1 Jun. 16, 2022

Related U.S. Application Data

(60) Provisional application No. 62/824,954, filed on Mar. 27, 2019.

(51) Int. Cl.
*H01J 37/05* (2006.01)
*H01J 37/147* (2006.01)

(52) U.S. Cl.
CPC ............ *H01J 37/05* (2013.01); *H01J 37/1474* (2013.01); *H01J 2237/1501* (2013.01); *H01J 2237/1508* (2013.01)

(58) Field of Classification Search
None
See application file for complete search history.

(56) References Cited

U.S. PATENT DOCUMENTS 6,797,955 B1   9/2004  Adler et al.
2005/0214958 A1   9/2005  Nakasuji et al.
(Continued)

FOREIGN PATENT DOCUMENTS

CN   101103417 A   1/2008
EP   2 385 542 B1   1/2013
(Continued)

OTHER PUBLICATIONS

Notice of Reasons for Rejection issued by the Japan Patent Office in related Japanese Patent Application No. 2021-556286; mailed Nov. 1, 2022 (12 pgs.).

(Continued)

*Primary Examiner* — Eliza W Osenbaugh-Stewart
(74) *Attorney, Agent, or Firm* — FINNEGAN, HENDERSON, FARABOW, GARRETT & DUNNER, LLP

(57) ABSTRACT

A multi-beam inspection apparatus including an adjustable beam separator is disclosed. The adjustable beam separator is configured to change a path of a secondary particle beam. The adjustable beam separator comprises a first Wien filter and a second Wien filter. Both Wien filters are aligned with a primary optical axis. The first Wien filter and the second Wien filter are independently controllable via a first excitation input and a second excitation input, respectively. The adjustable beam separator is configured move the effective (Continued)

bending point of the adjustable beam separator along the primary optical axis based on the first excitation input and the second excitation input.

19 Claims, 9 Drawing Sheets

(56) References Cited

U.S. PATENT DOCUMENTS

| | | |
|---|---|---|
| 2009/0218506 A1 | 9/2009 | Nakasuji et al. |
| 2010/0320382 A1 | 12/2010 | Almogy et al. |
| 2012/0318978 A1 | 12/2012 | Ren et al. |
| 2016/0268096 A1 | 9/2016 | Ren et al. |
| 2017/0092459 A1* | 3/2017 | Takahashi ............. H01J 37/147 |
| 2018/0158644 A1 | 6/2018 | Jiang et al. |
| 2019/0051487 A1* | 2/2019 | Ogasawara ......... H01J 37/3177 |

FOREIGN PATENT DOCUMENTS

| | | |
|---|---|---|
| EP | 2 579 274 A1 | 4/2013 |
| JP | 2007513460 A | 5/2007 |
| JP | 2011192498 A | 9/2011 |
| JP | 2012003902 A | 1/2012 |
| JP | 2013178880 A | 9/2013 |
| JP | 2015216075 A | 12/2015 |
| TW | 200634884 A | 10/2006 |
| TW | 201611075 A | 3/2016 |
| TW | 201833969 A | 9/2018 |
| WO | WO 02/056332 A1 | 7/2002 |
| WO | WO 2014/002734 A1 | 1/2014 |

OTHER PUBLICATIONS

International Search Report and Written Opinion issued by the International Searching Authority in related PCT Application No. PCT/EP2020/055959, mailed Apr. 22, 2020 (8 pgs.).

Office Action issued by the Taiwanese Patent Office in related Application No. TW 109110037, issued on Jan. 11, 2021 (14 pgs.).

* cited by examiner

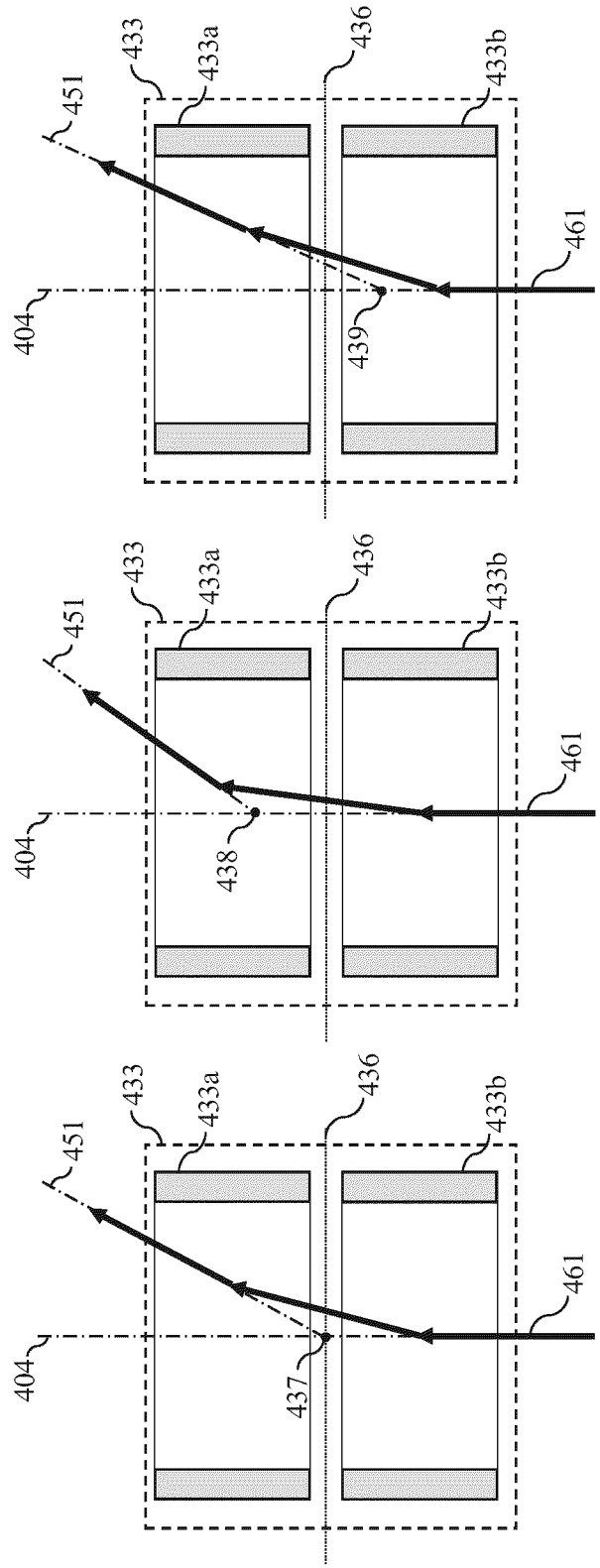

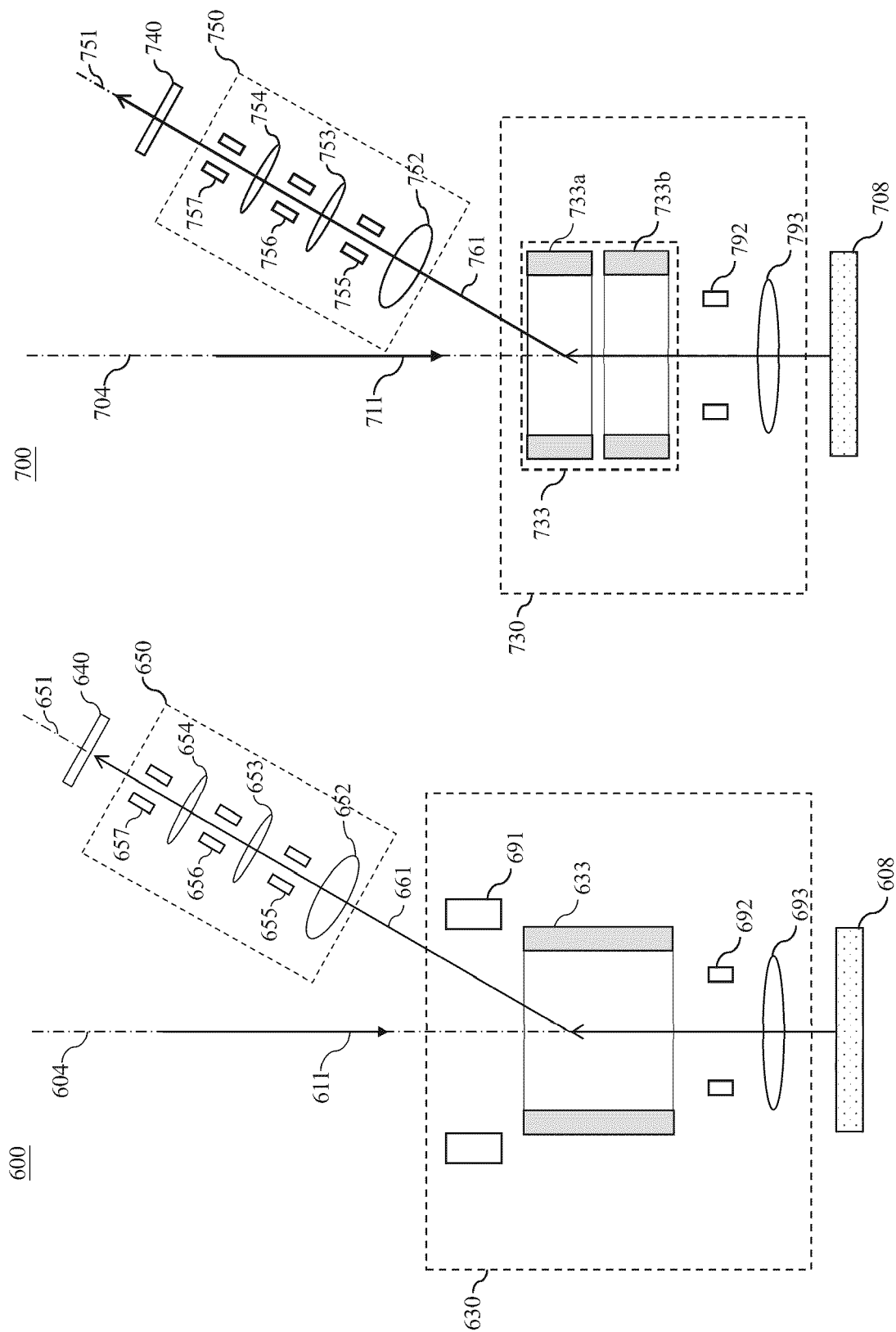

SYSTEM AND METHOD FOR ALIGNMENT OF SECONDARY BEAMS IN MULTI-BEAM INSPECTION APPARATUS

CROSS-REFERENCE TO RELATED APPLICATIONS

This application claims priority to International Application No. PCT/EP2020/055959, filed Mar. 6, 2020, and published as WO 2020/193102 A1, which claims priority of U.S. application 62/824,954 which was filed on Mar. 27, 2019. The contents of these applications are incorporated herein by reference in their entireties.

FIELD

The embodiments provided herein generally relate to a multi-beam inspection apparatus, and more particularly, a multi-beam inspection apparatus including an adjustable beam separator.

BACKGROUND

When manufacturing semiconductor integrated circuit (IC) chips, pattern defects or uninvited particles (residuals) inevitably appear on a wafer or a mask during fabrication processes, thereby reducing the yield. For example, uninvited particles may be troublesome for patterns with smaller critical feature dimensions, which have been adopted to meet the increasingly more advanced performance requirements of IC chips.

Pattern inspection tools with a charged particle beam have been used to detect the defects or uninvited particles. These tools typically employ a scanning electron microscope (SEM). In a SEM, a beam of primary electrons having a relatively high energy is decelerated to land on a sample at a relatively low landing energy and is focused to form a probe spot thereon. Due to this focused probe spot of primary electrons, secondary electrons will be generated from the surface. The secondary electrons may comprise backscattered electrons, secondary electrons, or Auger electrons, resulting from the interactions of the primary electrons with the sample. By scanning the probe spot over the sample surface and collecting the secondary electrons, pattern inspection tools may obtain an image of the sample surface.

SUMMARY

The embodiments provided herein disclose a particle beam inspection apparatus, and more particularly, a multi-beam inspection apparatus including an adjustable beam separator.

In some embodiments, the adjustable beam separator is configured to change a path of a secondary particle beam. The adjustable beam separator comprises a first Wien filter and a second Wien filter. Both Wien filters are aligned with a primary optical axis. The first Wien filter and the second Wien filter are independently controllable via a first excitation input and a second excitation input, respectively. The adjustable beam separator is configured move the effective bending point of the adjustable beam separator along the primary optical axis based on the first excitation input and the second excitation input.

In some embodiments, a primary projection system with an adjustable beam separator is disclosed. The primary projection system comprises an objective lens configured to focus a primary electron beam onto a sample, wherein a secondary electron beam is emitted from the sample in response to the primary electron beam. The primary projection system also includes an adjustable beam separator configured to change a path of the secondary electron beam at an effective bending point toward a secondary projection system. The adjustable beam separator comprises a first Wien filter aligned with a primary optical axis, wherein the first Wien filter is independently controllable via a first excitation input, and a second Wien filter aligned with the primary optical axis, wherein the second Wien filter is independently controllable via a second excitation input. The adjustable beam separator is configured to move the effective bending point of the adjustable beam separator along the primary optical axis based on the first excitation input and the second excitation input.

Other advantages of the present invention will become apparent from the following description taken in conjunction with the accompanying drawings wherein are set forth, by way of illustration and example, certain embodiments of the present invention.

BRIEF DESCRIPTION OF FIGURES

The above and other aspects of the present disclosure will become more apparent from the description of exemplary embodiments, taken in conjunction with the accompanying drawings.

FIGS. 4A, 4B, and 4C are schematic diagrams of an adjustable beam separator, consistent with embodiments of the present disclosure.

FIG. 6 is a schematic diagram of a multi-beam electron beam tool illustrating an exemplary configuration of a primary projection system with a conventional beam separator.

FIG. 7 is a schematic diagram of a multi-beam electron beam tool illustrating a primary projection system with an adjustable beam separator, consistent with embodiments of the present disclosure.

DETAILED DESCRIPTION

Figure 1:
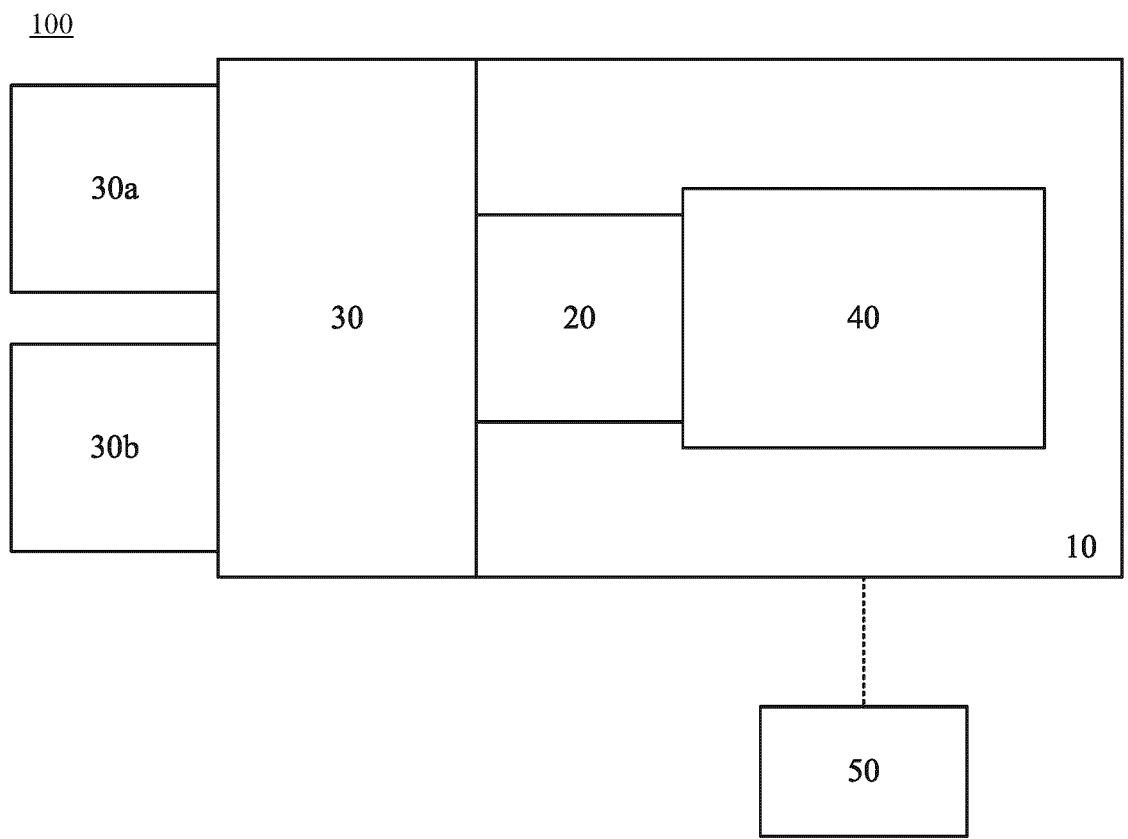
FIG. 1 is a schematic diagram illustrating an exemplary charged particle beam inspection system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective then the process can be adjusted so the defect is less likely to recur.

For high throughput inspection, some of the inspection systems use multiple focused beams of primary electrons. As the multiple focused beams can scan different parts of a wafer at the same time, multi-beam inspection system can inspect a wafer at a much higher speed than a single-beam inspection system. However, a conventional multi-beam inspection system can suffer low inspection accuracy due to the alignment errors among different parts of the inspection systems with respect to the paths that the electron beams travel. For example, all of the optical components for the secondary electron beams must be properly aligned with the optical components for the primary electron beams within, in some cases, approximately 100 μm offset, which is less than the thickness of a human hair; otherwise, a secondary electron beam can interfere with the detection of an adjacent secondary electron beam and the inspection image quality can suffer from aberrations and errors. One aspect of the present disclosure includes an improved secondary beam separator that is adjustable and that provides the ability to compensate the misalignment by adjusting the routing path of the secondary electron beams.

Relative dimensions of components in drawings may be exaggerated for clarity. Within the following description of drawings the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which is a schematic diagram illustrating an exemplary charged particle beam inspection system 100, consistent with embodiments of the present disclosure. As shown in FIG. 1, charged particle beam inspection system 100 includes a main chamber 10, a load lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b may, for example, receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load lock chamber 20.

Load lock chamber 20 may be connected to a load lock vacuum pump system (not shown), which removes gas molecules in load lock chamber 20 to reach a first pressure below the atmospheric pressure. After reaching the first pressure, one or more robot arms (not shown) transport the wafer from load lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single-beam inspection tool. In other embodiments, electron beam tool 40 may comprise a multi-beam inspection tool.

A controller 50 is electronically connected to electron beam tool 40. Controller 50 may be a computer configured to execute various controls of charged particle beam inspection system 100. Controller 50 may also include processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure.

While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools that operate under the second pressure.

Figure 2:
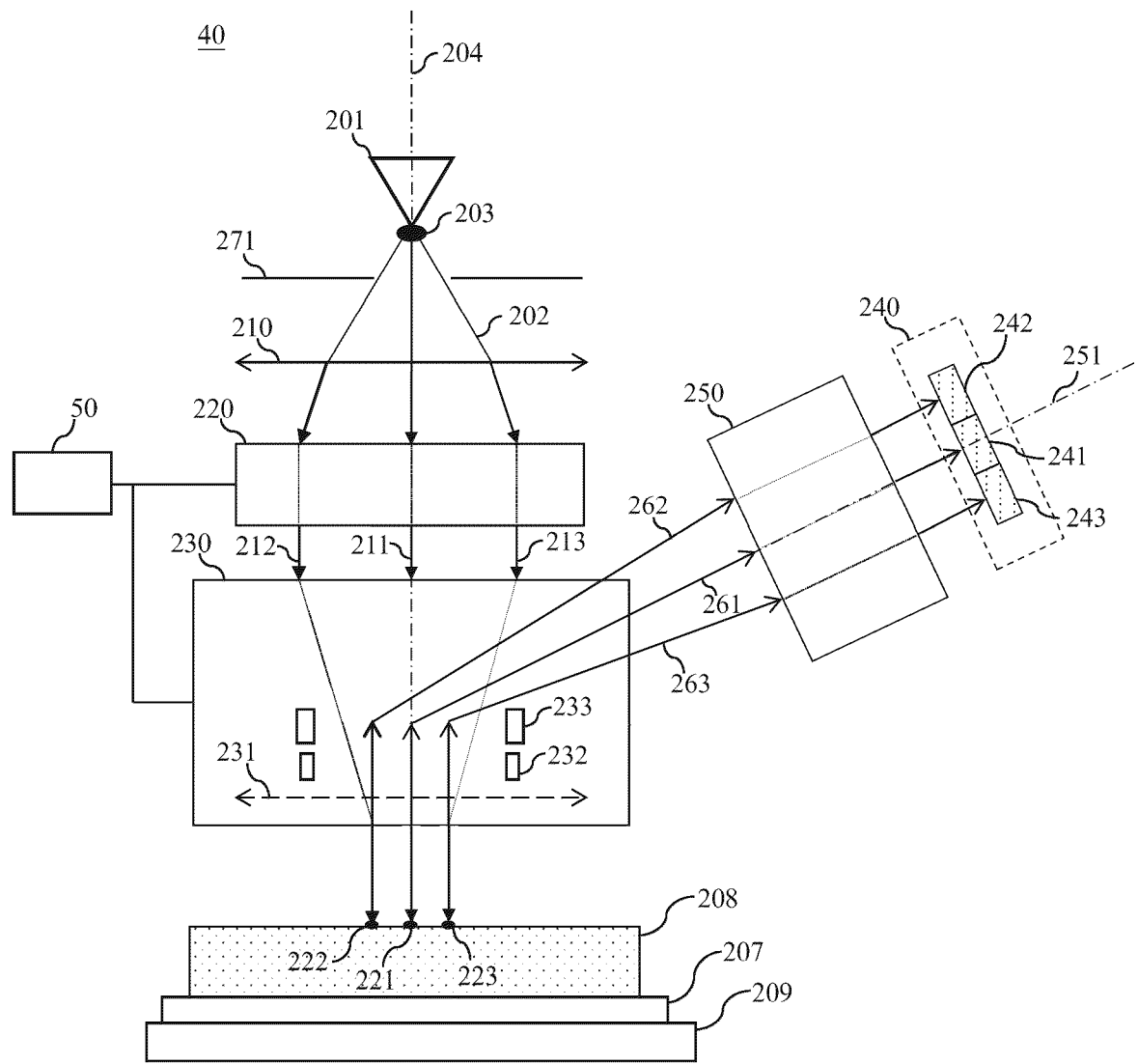
FIG. 2 is a schematic diagram illustrating an exemplary multi-beam apparatus that is part of the exemplary charged particle beam inspection system of FIG. 1, consistent with embodiments of the present disclosure.

Reference is now made to FIG. 2, which is a schematic diagram illustrating an exemplary electron beam tool 40 including a multi-beam inspection tool that is part of the exemplary charged particle beam inspection system 100 of FIG. 1, consistent with embodiments of the present disclosure. Multi-beam electron beam tool 40 (also referred to herein as apparatus 40) comprises an electron source 201, a gun aperture plate 271, a condenser lens 210, a source conversion unit 220, a primary projection system 230, a motorized stage 209, and a sample holder 207 supported by motorized stage 209 to hold a sample 208 (e.g., a wafer or a photomask) to be inspected. Multi-beam electron beam tool 40 may further comprise a secondary projection system 250 and an electron detection device 240. Primary projection system 230 may comprise an objective lens 231. A beam separator 233 and a deflection scanning unit 232 may be positioned inside primary projection system 230. Electron detection device 240 may comprise a plurality of detection elements 241, 242, and 243.

Electron source 201, gun aperture plate 271, condenser lens 210, source conversion unit 220, beam separator 233, deflection scanning unit 232, and primary projection system 230 may be aligned with a primary optical axis 204 of apparatus 40. Secondary projection system 250 and electron detection device 240 may be aligned with a secondary optical axis 251 of apparatus 40.

Electron source 201 may comprise a cathode (not shown) and an extractor or anode (not shown), in which, during operation, electron source 201 is configured to emit primary electrons from the cathode and the primary electrons are extracted or accelerated by the extractor and/or the anode to form a primary electron beam 202 that form a primary beam crossover (virtual or real) 203. Primary electron beam 202 may be visualized as being emitted from primary beam crossover 203.

Source conversion unit 220 may comprise an image-forming element array (not shown), an aberration compensator array (not shown), a beam-limit aperture array (not shown), and a pre-bending micro-deflector array (not shown). In some embodiments, the pre-bending micro-deflector array deflects a plurality of primary beamlets 211, 212, 213 of primary electron beam 202 to normally enter the beam-limit aperture array, the image-forming element array, and an aberration compensator array. In some embodiment, condenser lens 210 is designed to focus primary electron beam 202 to become a parallel beam and be normally incident onto source conversion unit 220. The image-forming element array may comprise a plurality of micro-deflectors or micro-lenses to influence the plurality of primary beamlets 211, 212, 213 of primary electron beam 202 and to form a plurality of parallel images (virtual or real) of primary beam crossover 203, one for each of the primary beamlets 211, 212, and 213. In some embodiments, the aberration compensator array may comprise a field curvature compensator array (not shown) and an astigmatism compensator array (not shown). The field curvature compensator array may comprise a plurality of micro-lenses to compensate field curvature aberrations of the primary beamlets 211, 212, and 213. The astigmatism compensator array may comprise a plurality of micro-stigmators to compensate astigmatism aberrations of the primary beamlets 211, 212, and 213. The beam-limit aperture array may be configured to limit diameters of individual primary beamlets 211, 212, and 213. FIG. 2 shows three primary beamlets 211, 212, and 213 as an example, and it is appreciated that source conversion unit 220 may be configured to form any number of primary beamlets. Controller 50 may be connected to various parts of charged particle beam inspection system 100 of FIG. 1, such as source conversion unit 220, electron detection device 240, primary projection system 230, or motorized stage 209. In some embodiments, as explained in further details below, controller 50 may perform various image and signal processing functions. Controller 50 may also generate various control signals to govern operations of the charged particle beam inspection system.

Condenser lens 210 is configured to focus primary electron beam 202. Condenser lens 210 may further be configured to adjust electric currents of primary beamlets 211, 212, and 213 downstream of source conversion unit 220 by varying the focusing power of condenser lens 210. Alternatively, the electric currents may be changed by altering the radial sizes of beam-limit apertures within the beam-limit aperture array corresponding to the individual primary beamlets. The electric currents may be changed by both altering the radial sizes of beam-limit apertures and the focusing power of condenser lens 210. Condenser lens 210 may be an adjustable condenser lens that may be configured so that the position of its first principle plane is movable. The adjustable condenser lens may be configured to be magnetic, which may result in off-axis beamlets 212 and 213 illuminating source conversion unit 220 with rotation angles. The rotation angles change with the focusing power or the position of the first principal plane of the adjustable condenser lens. Accordingly, condenser lens 210 may be an anti-rotation condenser lens that may be configured to keep the rotation angles unchanged while the focusing power of condenser lens 210 is changed. In some embodiments, condenser lens 210 may be an adjustable anti-rotation condenser lens, in which the rotation angles do not change when its focusing power and the position of its first principal plane are varied.

Objective lens 231 may be configured to focus beamlets 211, 212, and 213 onto sample 208 for inspection and may form, in the current embodiments, three probe spots 221, 222, and 223 on the surface of sample 208. Deflection scanning unit 232, in operation, is configured to deflect primary beamlets 211, 212, and 213 to scan probe spots 221, 222, and 223 across individual scanning areas in a section of the surface of sample 208. Gun aperture plate 271, in operation, is configured to block off peripheral electrons of primary electron beam 202 to reduce Coulomb effect. The Coulomb effect may enlarge the size of each of probe spots 221, 222, and 223 of primary beamlets 211, 212, 213, and therefore deteriorate inspection resolution.

In response to incidence of primary beamlets 211, 212, and 213 or probe spots 221, 222, and 223 on sample 208, electrons emerge from sample 208 and generate three secondary electron beams 261, 262, and 263. Each of secondary electron beams 261, 262, and 263 typically comprise secondary electrons (having electron energy ≤50 eV) and backscattered electrons (having electron energy between 50 eV and the landing energy of primary beamlets 211, 212, and 213).

Beam separator 233 may be a Wien filter comprising an electrostatic deflector generating an electrostatic dipole field and a magnetic deflector generating a magnetic dipole field (not shown). In operation, beam separator 233 may be configured to generate the electrostatic dipole field using the electrostatic deflector to exert electrostatic force on individual electrons of primary beamlets 211, 212, and 213. Beam separator 233 may also be configured to generate magnetic dipole field to exert magnetic force on the electrons. The electrostatic force is equal in magnitude but opposite in direction to the magnetic force. Primary beamlets 211, 212, and 213 may therefore pass at least substantially straight through beam separator 233 with at least substantially zero deflection angles.

However, secondary electron beams 261, 262, and 263 may be deflected towards secondary projection system 250, which subsequently focuses secondary electron beams 261, 262, and 263 onto detection elements 241, 242, and 243 of electron detection device 240. Detection elements 241, 242, and 243 are arranged to detect corresponding secondary electron beams 261, 262, and 263 and generate corresponding signals that are sent to controller 50 or a signal processing system (not shown), e.g. to construct images of the corresponding scanned areas of sample 208.

In some embodiments, detection elements 241, 242, and 243 detect corresponding secondary electron beams 261, 262, and 263, respectively, and generate corresponding intensity signal outputs (not shown) to an image processing system (e.g., controller 50). In some embodiments, each detection element 241, 242, and 243 may comprise one or more pixels. The intensity signal output of a detection element may be a sum of signals generated by all the pixels within the detection element.

In some embodiments, controller 50 may comprise an image processing system that includes an image acquirer (not shown) and a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 240 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 240 and may construct an image. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time sequence. The multiple images may be stored in the storage. In some embodiments, controller 50 may be configured to perform image processing steps with the multiple images of the same location of sample 208.

In some embodiments, controller 50 may include measurement circuitries (e.g., analog-to-digital converters) to obtain a distribution of the detected secondary electrons. The electron distribution data collected during a detection time window, in combination with corresponding scan path data of each of primary beamlets 211, 212, and 213 incident on the wafer surface, can be used to reconstruct images of the wafer structures under inspection. The reconstructed images can be used to reveal various features of the internal or external structures of sample 208, and thereby can be used to reveal any defects that may exist in the wafer.

In some embodiments, controller 50 may control motorized stage 209 to move sample 208 during inspection of sample 208. In some embodiments, controller 50 may enable motorized stage 209 to move sample 208 in a direction continuously at a constant speed. In other embodiments, controller 50 may enable motorized stage 209 to change the speed of the movement of sample 208 over time depending on the steps of scanning process. In some embodiments, controller 50 may adjust a configuration of primary projection system 230 or secondary projection system 250 based on images of secondary electron beams 261, 262, and 263.

Although FIG. 2 shows that electron beam tool 40 uses three primary electron beams, it is appreciated that electron beam tool 40 may use two or more primary electron beams. The present disclosure does not limit the number of primary electron beams used in apparatus 40.

Figure 3B:
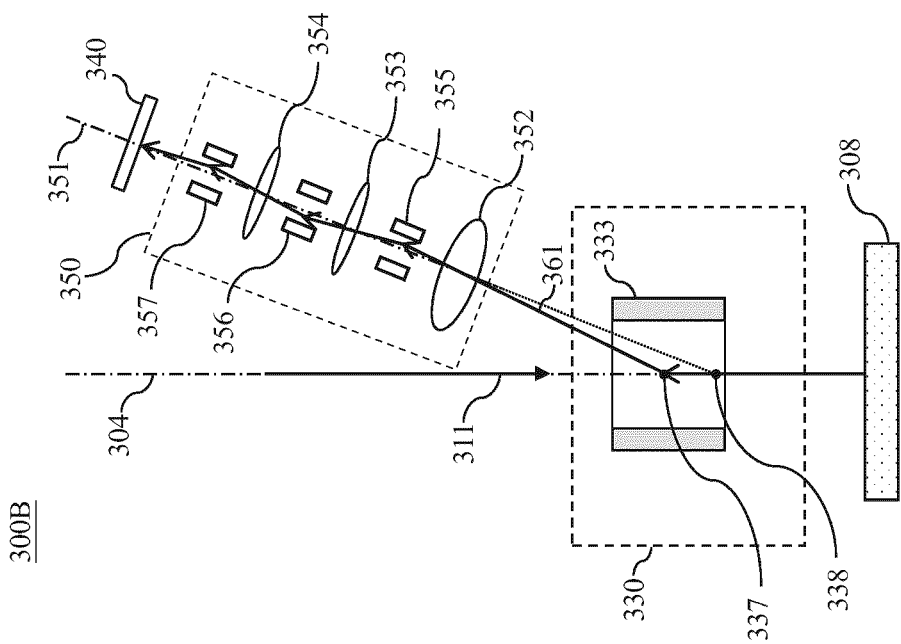
FIGS. 3A, 3B, and 3C are schematic diagrams of a multi-beam electron beam tool illustrating an exemplary configuration of a beam separator for secondary particle beams.
Figure 3A:
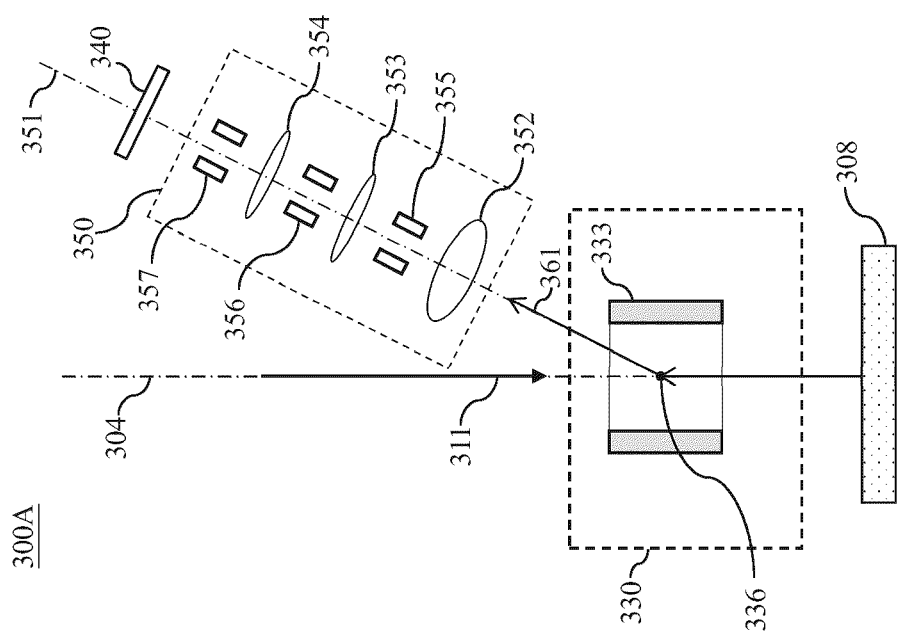

Reference is now made to FIG. 3A, which is a schematic diagram of a multi-beam electron beam tool 300A illustrating an exemplary configuration of a beam separator 333 for secondary particle beams. Multi-beam electron beam tool 300A may be the part of a multi-beam apparatus (such as multi-beam apparatus 100 of FIG. 1). In a multi-beam electron beam tool, a plurality of secondary electron beams (e.g., a secondary electron beam 361) are generated from a sample 308 in response to incidence of primary electron beams (e.g., primary electron beam 311). Secondary electron beam 361 is deflected by a beam separator 333 toward a secondary projection system 350, which focuses secondary electron beam 361 onto an electron detection device 340. Beam separator 333 may be a part of primary projection system 330.

In some embodiments, beam separator 333 may be a Wien filter comprising an electrostatic deflector generating an electrostatic dipole field and a magnetic deflector generating a magnetic dipole field (not shown). In operation, beam separator 333 may be configured to generate the electrostatic dipole field orthogonal to the magnetic dipole field, so that with respect to primary electrons—which are traveling in a downward direction along a primary optical axis 304—an electrostatic force induced by the electrostatic dipole field is equal in magnitude but opposite in direction to a magnetic force induced by the magnetic dipole field. Primary electron beam 311 may therefore pass at least substantially straight through beam separator 333 with at least substantially zero deflection angles. On the other hand, with respect to secondary electrons—which are traveling in an upward direction along primary optical axis 304—the electrostatic force and the magnetic force are exerted in the same direction; as a result, secondary beam 361 is deflected at a bending point 336 toward secondary projection system 350.

In some embodiments, secondary projection system 350 may comprise one or more lenses, such as a main zoom lens 352, a second zoom lens 353, and a projection lens 354, which are configured to focus secondary electron beam 361 onto electron detection device 340. Secondary projection system 350 may also comprise one or more deflectors, 355, 356, and 357, to deflect secondary electron beam 361. As shown in FIG. 3A, after deflected by beam separator 333, secondary electron beam 361 passes through the center of main zoom lens 352. In some embodiments, main zoom lens 352 may be a major lens in secondary projection system and have strong power of focusing; as a result, main zoom lens 352 may dominate the optical performance of secondary projection system 350. Accordingly, well-aligned main zoom lens 352 provides better performance.

Although FIG. 3A shows only one primary electron beam 311 and one secondary electron beam 361 to simplify the illustration, it is appreciated that multi-beam electron beam tool 300A may use any number of electron beams.

Reference is now made to FIG. 3B, which is a schematic diagram of a multi-beam electron beam tool 300B illustrating an effect of misalignment of a secondary projection system 350. Multi-beam electron beam tool 300B may be the part of a multi-beam apparatus (such as multi-beam apparatus 100 of FIG. 1). The misalignment may be caused by manufacturing and machining errors of the various components of primary projection system 330 and secondary projection system 350. Furthermore, because there are so many components integrated in primary projection system 330 and secondary projection system 350, even though each component is calibrated within a tolerance level after integration, the accumulated offsets may result in a substantial misalignment between primary projection system 330 and secondary projection system 350.

If secondary projection system 350 is not well aligned with primary projection system 330, the lenses (e.g., a main zoom lens 352, a second zoom lens 353, and a projection lens 354) and deflection modules (e.g., deflectors 355, 356, and 357) in secondary projection system 350 may introduce aberrations that could cause deformation in the shapes, intensities, and layout of secondary beam 361. This deformation may result in a reduced efficiency of secondary electron collection and an increased level of crosstalk, thereby deteriorating the quality of information generated by detection device 340.

For example, FIG. 3B shows multi-beam electron beam tool 300B in which main zoom lens 352 is not properly aligned, thereby causing a mismatch between an actual bending point 337 (which is determined by the position of beam separator 333) and a desired bending point 338 (a point where primary optical axis 304 meets secondary optical axis 351). In some embodiments, desired bending point 338 may be determined by overall alignment characteristics of secondary projection system 350. In some embodiments, desired bending point 338 may be determined by the alignment characteristics of main zoom lens 352 because main zoom lens 352 (with its high focusing power) may be the dominating factor of the optical performance of secondary projection system 350. In FIG. 3B, because secondary projection system 350 is not properly aligned with the center of beam separator 333, desired bending point 338 is lower than actual bending point 337. As explained above, this mismatch may introduce aberrations that could cause deformation in the shapes, intensities, and layout of secondary beam 361, which in turn may deteriorate the quality of information collected by detection device 340.

Although FIG. 3B shows only one primary electron beam 311 and one secondary electron beam 361 to simplify the illustration, it is appreciated that multi-beam electron beam tool 300B may use any number of electron beams.

Figure 3C:
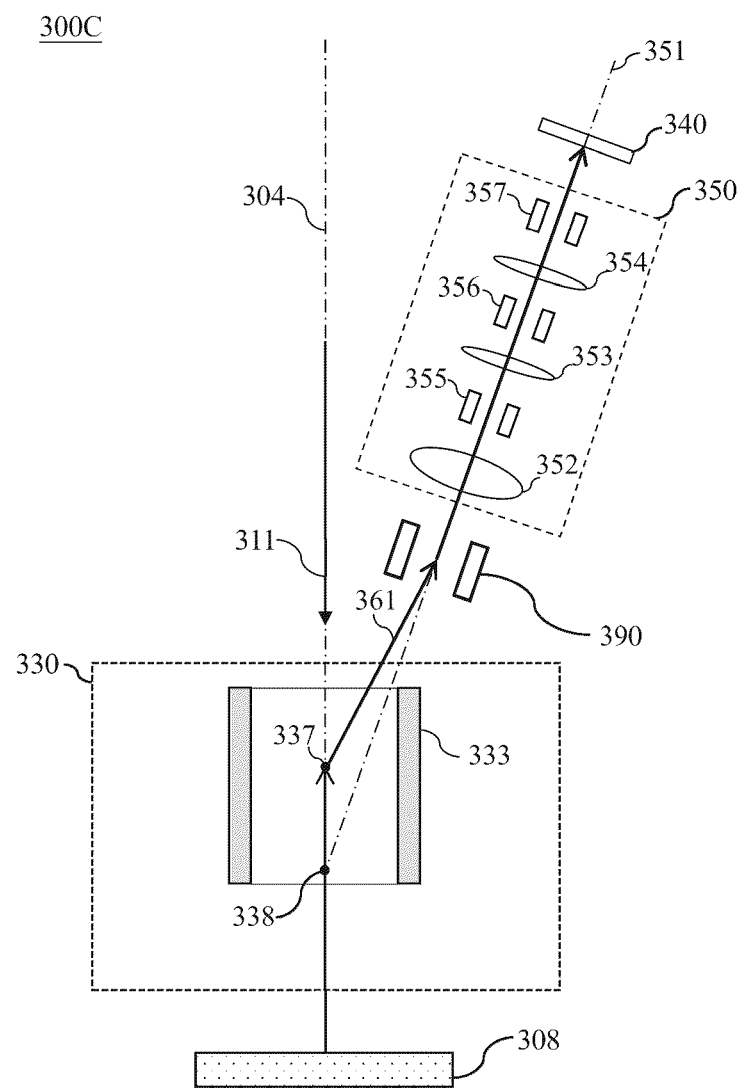

Reference is now made to FIG. 3C, which is a schematic diagram of a multi-beam electron beam tool 300C, wherein a pre-lens deflector 390 is introduced to alleviate the misalignment problem described earlier with respect to FIG. 3B. Multi-beam electron beam tool 300C may be the part of a multi-beam apparatus (such as multi-beam apparatus 100 of FIG. 1). In some embodiments, pre-lens deflector 390 may be added to the path of secondary electron beam 361 to compensate the effect of the misalignment. For example, pre-lens deflector 390 may be positioned between beam separator 333 and main zoom lens 352 so that pre-lens deflector 390 can bend secondary electron beam 361 to enable it to normally enter main zoom lens 352. However, adding pre-lens deflector 390 prior to main zoom lens 352 may require main zoom lens 352 to be positioned farther away from a sample 308. This increased distance between sample 308 and main zoom lens 352 may degrade the overall optical performance of secondary projection system 350 significantly. In a multi-beam apparatus, aberrations and errors of the secondary electron beams increase non-linearly (e.g., exponentially) when the distance between sample 308 and main zoom lens 352 increases. Accordingly, it is desirable to seek a different approach that address the misalignment problem without increasing the distance between sample 308 and main zoom lens 352.

Although FIG. 3C shows only one primary electron beam 311 and one secondary electron beam 361 to simplify the illustration, it is appreciated that multi-beam electron beam tool 300C may use any number of electron beams.

Reference is now made to FIGS. 4A, 4B, and 4C which are schematic diagrams illustrating the operation of an adjustable beam separator 433, consistent with embodiments of the present disclosure. In some embodiments, a beam separator may be implemented with two or more Wien filters. By adjusting the deflection power of each individual Wien filter, an effective bending point of the beam separator may be moved up and down along an optical axis 404. The effective bending point is a point where a projection of deflected secondary beam 451 coincides with primary optical axis 404.

In some embodiments, adjustable beam separator 433 may comprise an upper Wien filter 433a and a lower Wien filter 433b, wherein both Wien filters 433a and 433b may receive separate excitation inputs. By adjusting the excitation inputs independently, the effective bending point of adjustable beam separator 433 may move up and down along optical axis 404. Although FIGS. 4A, 4B, and 4C shows only one secondary electron beam 461 to simplify the illustration, it is appreciated that adjustable beam separator 433 may work with any number of secondary electron beams.

For example, as shown in FIG. 4A, if desired bending point 437 is close to center plane 436 of adjustable beam separator 433, upper Wien filter 433a and lower Wien filter 433b may be configured to deflect secondary electron beam 461 in the substantially same amount, so that the effective bending point of adjustable beam separator 433 matches desired bending point 437.

As shown in FIG. 4B, if desired bending point 438 is present above center plane 436, adjustable beam separator 433 may be configured so that the effective bending point can be moved upward toward desired bending point 438. This can be achieved by configuring upper Wien filter 433a to deflect a larger amount than lower Wien filter 433b, by relatively increasing the excitation input to upper Wien filter 433a while relatively decreasing the excitation input to lower Wien filter 433b, so that the effective bending point of adjustable beam separator 433 matches desired bending point 438.

On the other hand, if desired bending point 439 is present below center plane 436 as shown in FIG. 4C, adjustable beam separator 433 may be configured so that the effective bending point can be moved downward toward desired bending point 439. This can be achieved by configuring upper Wien filter 433a to deflect a smaller amount than lower Wien filter 433b, by relatively decreasing the excitation input to upper Wien filter 433a while relatively increasing the excitation input to lower Wien filter 433b, so that the effective bending point of adjustable beam separator 433 matches desired bending point 439.

In some embodiments, the overall height of adjustable beam separator 433 (i.e., sum of upper Wien filter 433a height and lower Wien filter 433b height) may be substantially the same as the height of a conventional beam separator with a single Wien filter (such as beam separator 333 of FIG. 3A). As explained in the earlier section, maintaining a short distance between the sample (such as sample 308 of FIG. 3A) and the main zoom lens (such as main zoom lens 352 of FIG. 3A) is desired because aberrations and errors of secondary electron beam increase exponentially as the distance increases between the sample and the main zoom lens. In some embodiments, adjustable beam separator 433 may be as powerful in deflecting electrons as the conventional beam separator, while adjustable beam separator 433 additionally provides the bending point adjustability. For example, even though each Wien filter (e.g., upper Wien filter 433a and lower Wien filter 433b) is smaller and accordingly capable of providing less deflection power than the conventional one-piece Wien filter, the combined deflection power of upper Wien filter 433a and lower Wien filter 433b may be substantially the same as the deflection power of the conventional Wien filter. Adjustable beam separator 433 may exert similar forces to electron beams as the conventional beam separator (such as beam separator 333 of FIG. 3A) and deflect the electron beams in a comparable amount.

Figure 5A:
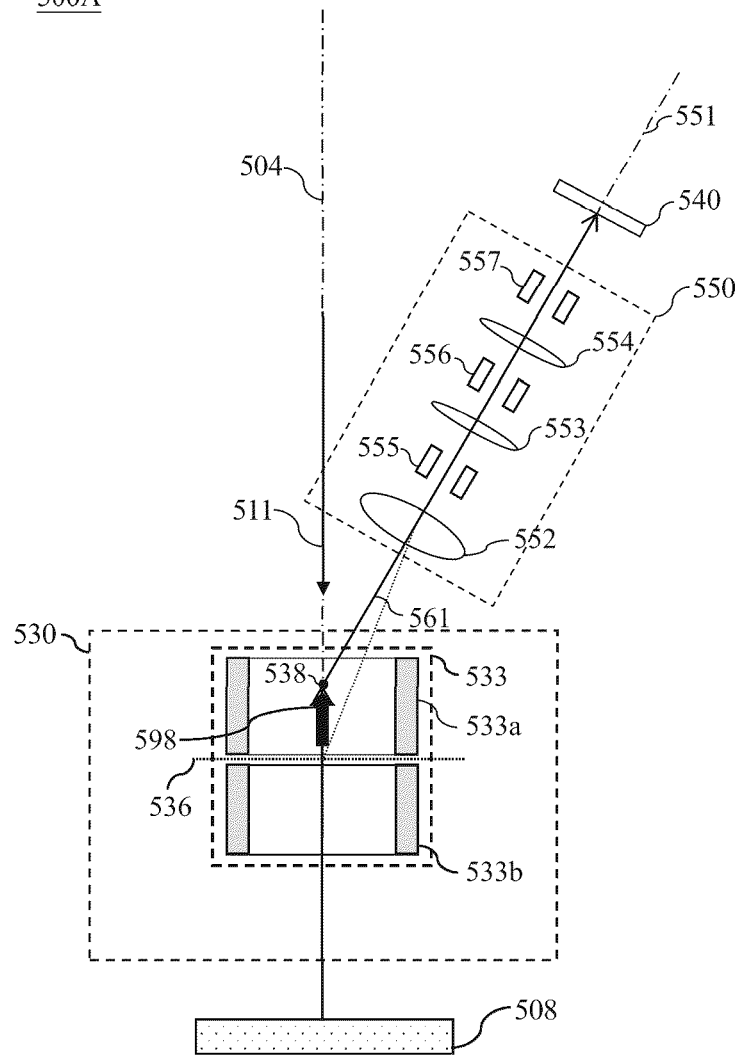
FIGS. 5A and 5B are schematic diagrams of a multi-beam electron beam tool with the adjustable beam separator of FIGS. 4A, 4B, and 4C, consistent with embodiments of the present disclosure.
Figure 5B:
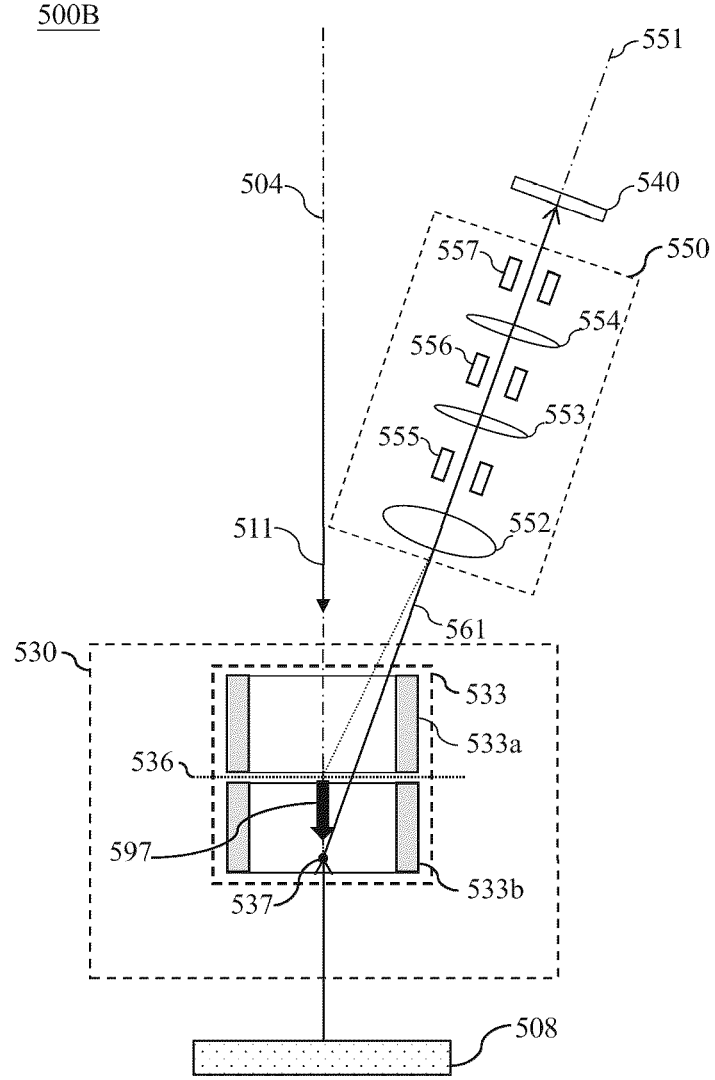

Reference is now made to FIGS. 5A and 5B, which are schematic diagrams of a multi-beam electron beam tool (e.g., 500A and 500B) with the adjustable beam separator of FIGS. 4A, 4B, and 4C, consistent with embodiments of the present disclosure. Multi-beam electron beam tool 500A or 500B may be the part of a multi-beam apparatus (such as multi-beam apparatus 100 of FIG. 1).

In some embodiments, multi-beam electron beam tool 500A and 500B may comprise a primary projection system 530 and secondary projection system 550. Primary projection system may include an adjustable beam separator 533. Secondary projection system 550 may comprise one or more lenses, such as a main zoom lens 552, a second zoom lens 553, and a projection lens 554, which are configured to focus secondary electron beam 561 onto electron detection device 540. Secondary projection system 550 may also comprise one or more deflectors, 555, 556, and 557, to deflect secondary electron beam 561.

Desired bending point 538 in FIG. 5A is above a center plane 536 of adjustable beam separator 533, because secondary projection system 550 is not properly aligned with the position of adjustable beam separator 533. In such a case, as described earlier with respect to FIG. 4B, adjustable beam separator 533 may be configured so that the effective bending point can be moved upward toward desired bending point 538 (as illustrated by arrow 598) by configuring upper Wien filter 533a to deflect more than lower Wien filter 533b. This can be done by relatively increasing the excitation input to upper Wien filter 533a while relatively decreasing the excitation input to lower Wien filter 533b.

In FIG. 5B, contrastingly, desired bending point 537 is below center plane 536 due to misalignment of secondary projection system 550. In such a case, as described earlier with respect to FIG. 4C, adjustable beam separator 533 may be configured so that the effective bending point can be moved downward toward desired bending point 537 (as illustrated by arrow 597) by configuring upper Wien filter 533a to deflect less than lower Wien filter 533b. This can be done by relatively decreasing the excitation input to upper Wien filter 533a while relatively increasing the excitation input to lower Wien filter 533b.

In some embodiments, upper Wien filter 533a and lower Wien filter 533b may be independently controlled by a controller (such as controller 50 of FIG. 2). For example, the controller may provide a first excitation control signal to upper Wien filter 533a and a second excitation control signal to lower Wien filter 533b. Based on the excitation control signals, each Wien filter may increase or decrease the deflection amount so that the effective bending point of adjustable beam separator 533 may accordingly move up or down.

In some embodiments, the controller may receive one or more inputs related to the adjustment of the effective bending point, wherein the controller may process the one or more inputs, detect the amount of misalignment, determine how much the bending point needs to be moved in which direction, and provide individual excitation control signals to Wien filters. The one or more inputs may be related to the alignment characteristics of secondary projection system 550 relative to adjustable beam separator 533. In some embodiments, the one or more inputs may be entered by an operator of multi-beam electron beam tool 500A and 500B. In some embodiments, the one or more inputs may be generated by a secondary electron beam image viewer that can be used to determine how well the electron optical elements (such as lenses, beam separator, deflectors, and detectors) in a multi-beam apparatus are aligned. Examples of the secondary electron beam image viewer can be found in U.S. Application No. 62/748,251, which is incorporated by reference in its entirety.

In some embodiments, adjustable beam separator 533 may be manually controlled by an operator of the multi-beam electron beam tool. For example, the operator, via a control interface (e.g., knobs, switches, computer interfaces, etc.), may gradually adjust the effective bending point up or down to find an optimum position. In some embodiments, the operator's control may be enhanced by a feedback mechanism. For example, the operator may monitor the secondary beam images produced by the secondary electron beam image viewer, while adjusting the location of effective bending point to the optimum position.

In some embodiments, adjustable beam separator 533 may be automatically controlled by a controller (such as controller 50 of FIG. 2). For example, the information produced by the secondary electron beam image viewer may be provided to the controller, wherein the controller may process the information from the secondary electron beam image viewer, detect the amount of misalignment, determine how much the bending point needs to be moved in which direction, and provide individual excitation control signals to Wien filters.

Although FIGS. 5A and 5B show only one primary electron beam 511 and one secondary electron beam 561 to simplify the illustration, it is appreciated that multi-beam electron beam tool 500A and 500B may use any number of electron beams.

Reference is now made to FIG. 6, which is a schematic diagram of a multi-beam electron beam tool 600 illustrating an exemplary configuration of a primary projection system 630 with a beam separator 633. Multi-beam electron beam tool 600 may be part of a multi-beam apparatus (such as multi-beam apparatus 100 of FIG. 1). In some embodiments, multi-beam electron beam tool 600 may comprise primary projection system 630 and a secondary projection system 650. Secondary projection system 650 may comprise one or more lenses, such as a main zoom lens 652, a second zoom lens 653, and a projection lens 654, which are configured to focus secondary electron beam 661 onto an electron detection device 640. Secondary projection system 650 may also comprise one or more deflectors, 655, 656, and 657, to deflect secondary electron beam 661. Primary projection system may include beam separator 633 and one or more deflectors (e.g., a No. 1 deflector 691 and a pre-objective-lens deflector 692) that deflect a primary electron beam 611 to scan the surface of a sample 608.

No. 1 deflector 691 and pre-objective-lens deflector 692 may generate an electrostatic field to deflect primary electron beam 611 for scanning Additionally, as described earlier with respect to FIG. 3A, beam separator 633 may include a Wien filter comprising an electrostatic deflector (generating an electrostatic dipole field) and a magnetic lens (generating a magnetic dipole field orthogonal to the electrostatic dipole field). Therefore, the total forces exerted on a passing electron (primary or secondary) by primary projection system 630 (including electrostatic forces and magnetic forces) may be represented as the equation (1) below:

$$F_{total\ 630} = F_{scanning\ No.\ 1\ deflector} + F_{scanning\ pre\text{-}objective\text{-}lens\ deflector} + \quad (1)$$
$$F_{Wien\ filter\ electrostatic} + F_{Wien\ filter\ magnetic}$$

As described earlier with respect to FIG. 3B, reducing the distance between sample 608 and main zoom lens 652 is desired because aberrations and errors of secondary electron beam 661 increase exponentially as the distance increases. However, one of the limiting factors in reducing the distance is the presence of No. 1 deflector 691, which is typically placed between beam separator 633 and main zoom lens 652. In some embodiments, replacing beam separator 633 with an adjustable beam separator (such as adjustable beam separator 533 of FIGS. 5A and 5B) may provide an opportunity to further reduce the distance between sample 608 and main zoom lens 652, as shown in FIG. 7.

Reference is now made to FIG. 7, which is a schematic diagram of a multi-beam electron beam tool 700 illustrating a primary projection system 730 with an adjustable beam separator 733, consistent with embodiments of the present disclosure. Multi-beam electron beam tool 700 may be part of a multi-beam apparatus (such as multi-beam apparatus 100 of FIG. 1). Multi-beam electron beam tool 700 may also comprise primary projection system 730 and a secondary projection system 750 similar to electron beam tool 600 of FIG. 6. In some embodiments, however, primary projection system 730 may include an adjustable beam separator 733 instead of a conventional one-piece beam separator, such as beam separator 633 of FIG. 6.

Using adjustable beam separator 733 may provide several advantages over a conventional system (such as electron beam tool 600 of FIG. 6). First, as described in the earlier sections, adjustable beam separator 733 provides the capability to reduce aberrations caused by misalignment of secondary projection system 750 by moving the effective bending point of secondary electron beam 761 up or down along a primary optical axis 704, thereby enabling secondary electron beam to travel substantially close to the center of a main zoom lens 752.

Second, in some embodiments, a No. 1 deflector (such as No. 1 deflector 691 of FIG. 6) may be omitted so that a main zoom lens 752 can be placed closer to a sample 708, thereby further improving the optical performance of secondary projection system 750. In place of the omitted No. 1 deflector, in some embodiments, the electrostatic deflector within a Wien filter (e.g., an upper Wien filter 733a or a lower Wien filter 733b) may also function as the No. 1 deflector for primary electron beam scanning. In such embodiments, the scanning control input that was applied to No. 1 deflector may be overridden to the excitation input to the electrostatic deflector of a Wien filter.

Similar to the equation (1) above, the total forces exerted on a passing electron (primary or secondary) by primary projection system may be represented based on Equation (2) below:

$$F_{total\ 730} = F_{pre\text{-}objective\text{-}lens\ deflector} + \quad (2)$$
$$F_{Wien\ filter\ electrostatic\ OVERRIDDEN} + F_{Wien\ filter\ magnetic}$$

Because the electrostatic force generated by the electrostatic deflector within a Wien filter is the sum of the force for the original Wien filter function and the force for the overridden scanning function (as shown in equation (3) below), the total force by primary projection system 730 ($F_{total\ 730}$) is substantially the same as the total force by primary projection system 630 ($F_{total\ 630}$).

$$F_{Wien\ filter\ electrostatic\ OVERRIDDEN} = \quad (3)$$
$$F_{Wien\ filter\ electrostatic} + F_{scanning\ No.\ 1\ deflector}$$

In some embodiments, more than one Wien filter (e.g., both upper Wien filter 733a and a lower Wien filter 733b) may be overridden to serve as the No. 1 deflector by distributing the scanning control input to the multiple Wien filters. Moreover, to further reduce the distance between sample 708 and main zoom lens 752, in some embodiments, a pre-objective-lens deflector 792 may also be omitted. In such embodiments, the scanning function of the omitted pre-objective-lens deflector 792 may be overridden to one or more of Wien filters similar to the overriding of No. 1 deflector. For example, in some embodiments, upper Wien filter 733a may serve as the No. 1 deflector (such as No. 1 deflector 691 of FIG. 6) and lower Wien filter 733b may serve as pre-objective-lens deflector 792.

Figure 8:
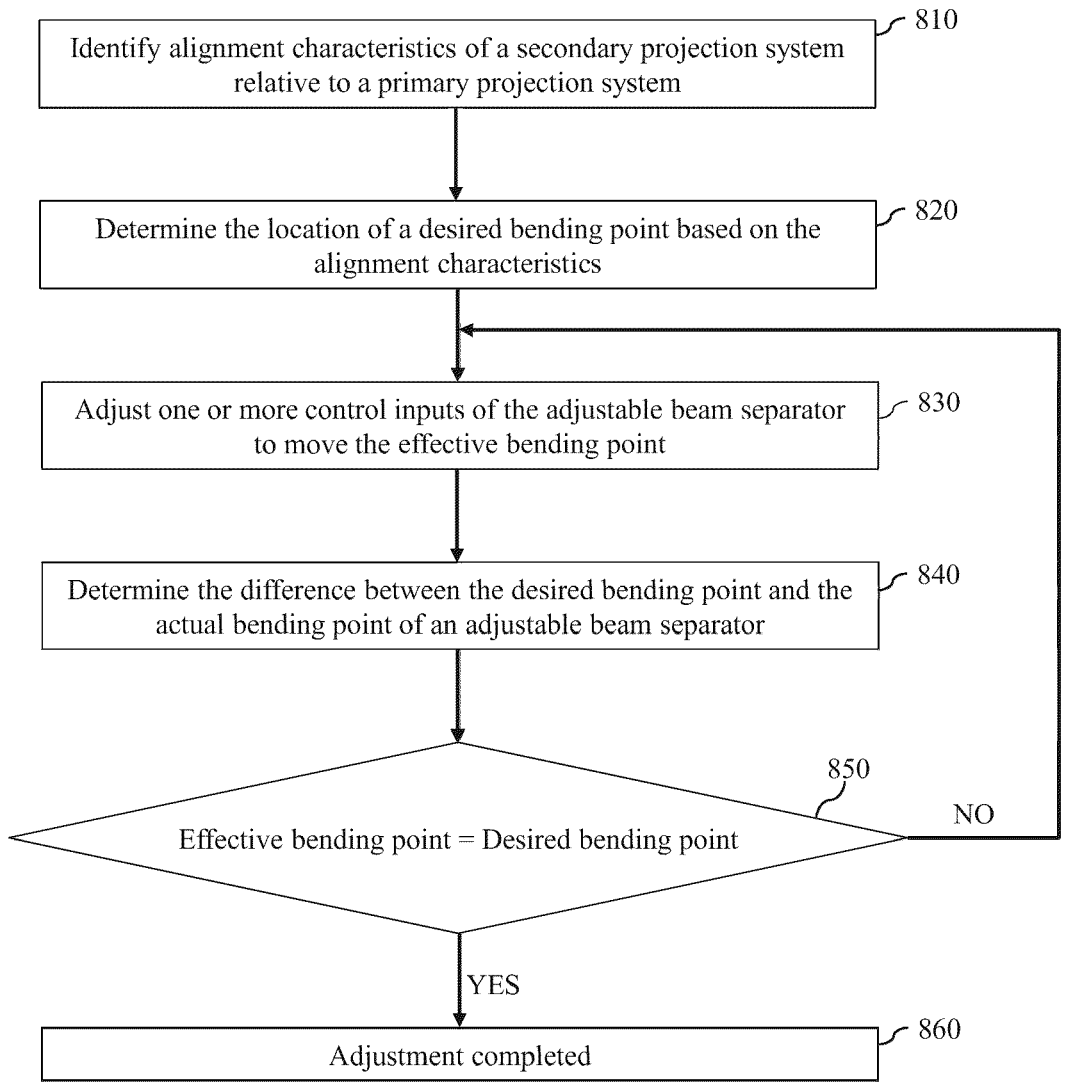
FIG. 8 is a flow chart illustrating an exemplary method of controlling an adjustable beam separator, consistent with embodiments of the present disclosure.

Reference is now made to FIG. 8, which is a flow chart illustrating an exemplary method of controlling an adjustable beam separator, consistent with embodiments of the present disclosure.

In some embodiments, a multi-beam electron beam tool (such as multi-beam electron beam tool 500A of FIG. 5A) may comprise a primary projection system (such as primary projection system 530 of FIG. 5A) and a secondary projection system (such as secondary projection system 550 of FIG. 5A). The secondary projection system may comprise one or more lenses, such as a main zoom lens, a second zoom lens, and a projection lens (such as 552, 553, and 554 of FIG. 5A, respectively), which are configured to focus secondary electron beams (such as secondary electron beam 561 of FIG. 5A) onto an electron detection device (such as electron beam device 540 of FIG. 5A). The secondary projection system may also comprise one or more deflectors (such as deflectors 555, 556, and 557 of FIG. 5A), to deflect the secondary electron beams. Primary projection system may further include an adjustable beam separator (such as adjustable beam separator 533 of FIG. 5A). The adjustable beam separator may comprise a plurality of Wien filters, for example, an upper Wien filter (such as 533a of FIG. 5A) and a lower Wien filter (such as 533b of FIG. 5A).

If the secondary projection system is not well aligned with the primary projection system, the optical components of secondary projection system may introduce aberrations that could cause deformation in the shapes, intensities, and layout of secondary beam images. This deformation may result in a reduced efficiency of secondary electron collection and an increased level of crosstalk, thereby deteriorating the quality of information generated by the electron detection device. In such scenarios, to reduce the aberrations and errors, the adjustable beam separator may be configured so that the effective bending point of the beam separator can be moved upward or downward toward a desired bending point so that secondary electron beams can pass substantially close to the center of the main zoom lens of secondary projection system, as described earlier with respect to FIGS. 5A and 5B.

In step 810, the multi-beam electron beam tool identifies alignment characteristics of the secondary projection system relative to the primary projection system, in particular relative to the beam separator. In some embodiments, this information can be measured and provided by an operator of the multi-beam electron beam tool. In some embodiments, the multi-beam electron beam tool may include a secondary electron beam image viewer, which can be used to determine the alignment characteristics.

In step 820, the multi-beam electron beam tool determines a location of a desired bending point based on the identified alignment characteristics of secondary projection system.

In step 830, the multi-beam electron beam tool adjusts one or more control inputs of the adjustable beam separator to move the effective bending point upward or downward toward the position of the desired bending point. In some embodiments, the Wien filters of the adjustable beam separator may be independently controlled to move the effective bending point. For example, the upper Wien filter and the lower Wien filter (such as 533a and 533b of FIG. 5A) may be independently controlled by a controller (such as controller 50 of FIG. 2). The controller may provide a first excitation control signal to the upper Wien filter and a second excitation control signal to the lower Wien filter. Based on the excitation control signals, each Wien filter may increase or decrease the deflection amount so that the effective bending point of the adjustable beam separator may accordingly move up or down.

In step 840, the multi-beam electron beam tool determines the difference between the location of the desired bending point and the location of actual bending point after the adjustment performed in step 830. And then, in step 850, the multi-beam electron beam tool determines whether the adjusted effective bending point is substantially close to the location of the desired bending point. In some embodiments, the determination may be based on the characteristics of detected secondary electrons. In some embodiments, the determination may be based on the characteristics of produced images of the sample. If the answer is no, the multi-beam electron beam tool performs steps 830 and 840 repeatedly until the adjusted bending point matches the desired bending point. When the adjusted bending point becomes substantially close to the location of desired bending point, the adjustment process is completed in step 860.

The embodiments may further be described using the following clauses:

1. An adjustable charged particle beam separator configured to change a path of a secondary particle beam, comprising:
    a first Wien filter aligned with a primary optical axis, wherein the first Wien filter is independently controllable via a first excitation input; and
    a second Wien filter aligned with the primary optical axis, wherein the second Wien filter is independently controllable via a second excitation input, and
    wherein the adjustable charged particle beam separator is configured to enable an effective bending point of the adjustable charged particle beam separator to be moved based on the first excitation input and the second excitation input.

2. The adjustable charged particle beam separator of clause 1, wherein the adjustable charged particle beam separator is configured to enable the effective bending point to be moved along the primary optical axis.

3. The adjustable charged particle beam separator of any one of clauses 1 and 2, wherein the adjustable charged particle beam separator is configured to enable the effective bending point to be positioned close to the first Wien filter and away from the second Wien filter along the primary optical axis when the first excitation input is higher than the second excitation input.

4. The adjustable charged particle beam separator of any one of clauses 1 and 2, wherein the adjustable charged particle beam separator is configured to enable the effective bending point to be positioned close to the second Wien filter and away from the first Wien filter along the primary optical axis when the second excitation input is higher than the first excitation input.

5. The adjustable charged particle beam separator of any one of clauses 1-4, wherein the adjustable charged particle beam separator is configured to enable the effective bending point to be moved when the first excitation input and the second excitation input are adjusted.

6. The adjustable charged particle beam separator of any one of clauses 1-5, wherein the adjustable charged particle beam separator is configured to enable the effective bending point to be moved based on alignment characteristics of a secondary projection system relative to the adjustable charged particle beam separator to compensate an alignment error of the secondary projection system.

7. The adjustable charged particle beam separator of clause 6, wherein the alignment characteristics of the secondary projection system comprises alignment characteristics of a main zoom lens in the secondary projection system.

8. The adjustable charged particle beam separator of any one of clauses 1-7, wherein the first Wien filter is further configured to deflect a primary particle beam to scan a sample.

9. The adjustable charged particle beam separator of clause 8, wherein the first Wien filter comprises a magnetic deflector and an electrostatic deflector, the electrostatic deflector generating an electrostatic field, based on a third excitation input, to deflect the primary particle beam to scan the sample.

10. A primary projection system, comprising:
    an objective lens configured to focus a primary electron beam onto a sample, wherein a secondary electron beam is emitted from the sample in response to the primary electron beam; and
    an adjustable beam separator configured to change a path of the secondary electron beam, the adjustable beam separator comprising:
        a first Wien filter aligned with a primary optical axis, wherein the first Wien filter is independently controllable via a first excitation input; and
        a second Wien filter aligned with the primary optical axis, wherein the second Wien filter is independently controllable via a second excitation input,
        wherein the adjustable beam separator is configured to enable an effective bending point of the adjustable beam separator to be moved based on the first excitation input and the second excitation input.

11. The primary projection system of clause 10, wherein the adjustable beam separator is configured to enable the effective bending point to be moved along the primary optical axis.

12. The primary projection system of any one of clauses 10 and 11, wherein the adjustable beam separator is configured to enable the effective bending point to be positioned close to the first Wien filter and away from the second Wien filter along the primary optical axis when the first excitation input is higher than the second excitation input.

13. The primary projection system of any one of clauses 10 and 11, wherein the adjustable beam separator is configured to enable the effective bending point to be positioned close to the second Wien filter and away from the first Wien filter along the primary optical axis when the second excitation input is higher than the first excitation input.

14. The primary projection system of any one of clauses 10-13, wherein the adjustable beam separator is configured to enable the effective bending point to be moved when the first excitation input and the second excitation input are adjusted.

15. The primary projection system of any one of clauses 10-13, wherein the adjustable beam separator is configured to enable the effective bending point to be moved based on the alignment characteristics of a secondary projection system relative to the adjustable beam separator to compensate an alignment error of the secondary projection system.

16. The primary projection system of clause 15, wherein the alignment characteristics of the secondary projection system comprises alignment characteristics of a main zoom lens in the secondary projection system.

17. The primary projection system of any one of clauses 10-16, wherein the first Wien filter is further configured to deflect a primary particle beam to scan the sample.

18. The primary projection system of clause 17, wherein the first Wien filter comprises a magnetic deflector and an electrostatic lens, the electrostatic deflector generating an electrostatic field, based on a third excitation input, to deflect the primary particle beam to scan the sample.

19. A multi-beam apparatus for inspecting a sample, comprising:
  a primary projection system of any one of clauses 10-18;
  a secondary projection system configured to focus a secondary electron beam onto an electron detection device; and
  a controller including circuitry to control the primary projection system.

20. The multi-beam apparatus of clause 19, wherein the controller includes circuitry to adjust the first excitation input and the second excitation input to move the effective bending point based on the alignment characteristics of the secondary projection system relative to the adjustable beam separator of the primary projection system to compensate the alignment error of the secondary projection system.

21. The multi-beam apparatus of clause 20, wherein the controller includes circuitry to adjust the third excitation input to deflect a primary electron beam to scan the sample.

22. The multi-beam apparatus of any one of clauses 19-21, further comprising an image viewer configured to provide information to the controller for adjusting the first excitation input and the second excitation input.

23. A method of inspecting a wafer using a multi-beam system with a secondary projection system to project a plurality of secondary electron beams onto a detection surface, the method comprising:
  determining a location of a desired bending point of an adjustable beam separator based on alignment characteristics of the secondary projection system; and
  sending one or more control signals to the adjustable beam separator to cause an effective bending point of the adjustable beam separator to be moved along a primary optical axis toward the location of the desired bending point.

24. The method of clause 23, further comprising:
  determining a difference between the location of the desired bending point and a location of the effective bending point after an effective bending point adjustment is performed; and
  repeating the effective bending point adjustment following a determination of the difference between the location of the desired bending point and the location of the effective bending point, until the location of the effective bending point becomes substantially close to the location of the desired bending point.

25. The method of any one of clauses 23 and 24, wherein the adjustable beam separator comprises a first Wien filter and a second Wien filter, and wherein adjusting one or more control signals comprises individually adjusting a first excitation input to the first Wien filter and a second excitation input to the second Wien filter.

26. The method of clause 25, wherein adjusting one or more control signals further comprises configuring the first excitation input to be higher than the second excitation input to enable moving the effective bending point toward the first Wien filter.

27. The method of clause 25, wherein adjusting one or more control signals further comprises configuring the second excitation input to be higher than the first excitation input to enable moving the effective bending point toward the second Wien filter.

28. The method of any one of clauses 23-27, wherein the alignment characteristics of the secondary projection system is identified based on one or more images of the plurality of secondary electron beams produced by a secondary electron beam image viewer.

A non-transitory computer readable medium may be provided that stores instructions for a processor of a controller (e.g., controller 50 of FIG. 1) to carry out the adjustment of a beam separator (e.g., the controlling an adjustable beam separator of FIG. 8). Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. A multi-beam apparatus for inspecting a sample, comprising:
   a primary projection system configured to project a primary particle beam onto the sample, comprising:
      an adjustable charged particle beam separator configured to change a path of a secondary particle beam at an effective bending point, comprising:
         a first Wien filter aligned with a primary optical axis, wherein the first Wien filter is independently controllable via a first excitation input; and
         a second Wien filter aligned with the primary optical axis, wherein the second Wien filter is independently controllable via a second excitation input, and
   a secondary projection system comprising a deflector and a lens that are configured to project the secondary particle beam onto a detection surface,
   wherein the adjustable charged particle beam separator is configured to enable the effective bending point to be moved based on the first excitation input and the second excitation input, which are adjusted based on alignment characteristics of the secondary projection system.

2. The multi-beam apparatus of claim 1, wherein the adjustable charged particle beam separator is configured to enable the effective bending point to be moved along the primary optical axis.

3. The multi-beam apparatus of claim 1, wherein the adjustable charged particle beam separator is configured to enable the effective bending point to be positioned close to the first Wien filter and away from the second Wien filter along the primary optical axis when the first excitation input is higher than the second excitation input.

4. The multi-beam apparatus of claim 1, wherein the adjustable charged particle beam separator is configured to enable the effective bending point to be positioned close to the second Wien filter and away from the first Wien filter along the primary optical axis when the second excitation input is higher than the first excitation input.

5. The multi-beam apparatus of claim 1, wherein the adjustable charged particle beam separator is configured to enable the effective bending point to be moved when the first excitation input and the second excitation input are adjusted.

6. The multi-beam apparatus of claim 1, wherein the adjustable charged particle beam separator is further configured to move the effective bending point based on alignment characteristics of the secondary projection system relative to the adjustable charged particle beam separator to compensate an alignment error of the secondary projection system.

7. The multi-beam apparatus of claim 6, wherein the alignment characteristics of the secondary projection system comprises alignment characteristics of the main zoom lens in the secondary projection system.

8. The multi-beam apparatus of claim 1, wherein the first Wien filter is further configured to deflect the primary particle beam to scan the sample.

9. The multi-beam apparatus of claim 8, wherein the first Wien filter comprises a magnetic deflector and an electrostatic deflector, the electrostatic deflector generating an electrostatic field, based on a third excitation input, to deflect the primary particle beam to scan the sample.

10. A method of inspecting a wafer using a multi-beam system with a secondary projection system to project a plurality of secondary electron beams onto a detection surface, the method comprising:
    determining a location of a desired bending point of an adjustable beam separator based on alignment characteristics of the secondary projection system; and
    adjusting one or more control signals to the adjustable beam separator to cause an effective bending point of the adjustable beam separator to be moved along a primary optical axis toward the location of the desired bending point;
    wherein the adjustable beam separator comprises a first Wien filter and a second Wien filter, and the one or more control signals comprise a first excitation input to the first Wien filter and a second excitation input to the second Wien filter to individually control each of the first and the second Wien filters.

11. The method of claim 10, further comprising:
    determining a difference between the location of the desired bending point and a location of the effective bending point after an effective bending point adjustment is performed; and
    repeating the effective bending point adjustment following a determination of the difference between the location of the desired bending point and the location of the effective bending point, until the location of the effective bending point becomes substantially close to the location of the desired bending point.

12. The method of claim 10, wherein adjusting one or more control signals further comprises configuring the first excitation input to be higher than the second excitation input to enable moving the effective bending point toward the first Wien filter.

13. The method of claim 10, wherein adjusting one or more control signals further comprises configuring the second excitation input to be higher than the first excitation input to enable moving the effective bending point toward the second Wien filter.

14. The method of claim 10, wherein the alignment characteristics of the secondary projection system is identified based on one or more images of the plurality of secondary electron beams produced by a secondary electron beam image viewer.

15. A non-transitory computer readable medium storing a set of instructions that are executable by one or more processors of a multi-beam apparatus having a primary projection system and a secondary projection system to cause the multi-beam apparatus to perform operations for projecting a plurality of secondary electron beams onto a detection surface, the operations comprising:
    determining a location of a desired bending point of an adjustable beam separator in the primary projection system based on alignment characteristics of the secondary projection system; and
    adjusting one or more control signals to the adjustable beam separator to cause an effective bending point of the adjustable beam separator to be moved along a primary optical axis toward the location of the desired bending point;
    wherein the adjustable beam separator comprises a first Wien filter and a second Wien filter, and the one or more control signals comprise a first excitation input to the first Wien filter and a second excitation input to the second Wien filter to individually control each of the first and the second Wien filters.

16. The non-transitory computer readable medium of claim 15, the operations further comprising:
obtaining data derived from a difference between the location of the desired bending point and a location of the effective bending point after an effective bending point adjustment is performed; and
causing the effective bending point to be repeatedly adjusted following a determination of the difference between the location of the desired bending point and the location of the effective bending point, until the location of the effective bending point becomes substantially close to the location of the desired bending point.

17. The non-transitory computer readable medium of claim 15, wherein adjusting one or more control signals further comprises configuring the first excitation input to be higher than the second excitation input to enable moving the effective bending point toward the first Wien filter.

18. The non-transitory computer readable medium of claim 15, wherein adjusting one or more control signals further comprises configuring the second excitation input to be higher than the first excitation input to enable moving the effective bending point toward the second Wien filter.

19. The non-transitory computer readable medium of claim 15, wherein the alignment characteristics of the secondary projection system is identified based on one or more images of the plurality of secondary electron beams produced by a secondary electron beam image viewer.

* * * * *